(12) United States Patent
Hayashi et al.

(10) Patent No.: US 7,694,194 B2
(45) Date of Patent: Apr. 6, 2010

(54) SEMICONDUCTOR DEVICE

(75) Inventors: Hideki Hayashi, Ome (JP); Mitsuo Serizawa, Sagamihara (JP)

(73) Assignee: Hitachi ULSI Systems Co., Ltd., Tokyo (JP)

( * ) Notice: Subject to any disclaimer, the term of this patent is extended or adjusted under 35 U.S.C. 154(b) by 243 days.

(21) Appl. No.: 11/764,862

(22) Filed: Jun. 19, 2007

(65) Prior Publication Data

US 2008/0028267 A1 Jan. 31, 2008

(30) Foreign Application Priority Data

Jul. 28, 2006 (JP) .............................. 2006-206077

(51) Int. Cl.
*G11C 29/34* (2006.01)
*G11C 29/50* (2006.01)

(52) U.S. Cl. ...................... 714/718; 714/733
(58) Field of Classification Search .................. None
See application file for complete search history.

(56) References Cited

U.S. PATENT DOCUMENTS 5,239,509 A * 8/1993 Ikawa et al. ................. 365/201
6,671,842 B1 * 12/2003 Phan et al. .................. 714/733
6,834,361 B2 * 12/2004 Abbott ........................ 714/42
2003/0140289 A1 * 7/2003 Endo et al. .................. 714/718
2004/0128406 A1 * 7/2004 Chen et al. .................. 710/20

FOREIGN PATENT DOCUMENTS

JP 64-059173 A 3/1989

* cited by examiner

*Primary Examiner*—Kevin L Ellis
*Assistant Examiner*—Dipakkumar Gandhi
(74) *Attorney, Agent, or Firm*—Miles & Stockbridge P.C.

(57) ABSTRACT

A highly reliable semiconductor device includes, for example, a memory circuit MEM such as a multiport RAM and a BIST circuit (BIST[A] and BIST[B]) for carrying out a test for each of the ports PO[A] and PO[B] of the MEM, as well as pointers PNT0[A] to PNT3[A] and PNT0[B] to PNT3[B] corresponding to the PO[A] and PO[B], respectively. Each of the BIST[A] and BIST[B] manages plural respective segments SEG0 to SEG3 obtained by dividing the MEM and the PNT0[A] to PNT3[A] are provided for those SEG0 to SEG3, respectively. For example, the BIST[A], upon accessing SEG0, writes '1' in PNT0[A] while the BIST[B] refers to the value in this PNT0[A], thereby its access to SEG0 can be avoided. Consequently, each port can execute a complicated test pattern asynchronously.

14 Claims, 13 Drawing Sheets

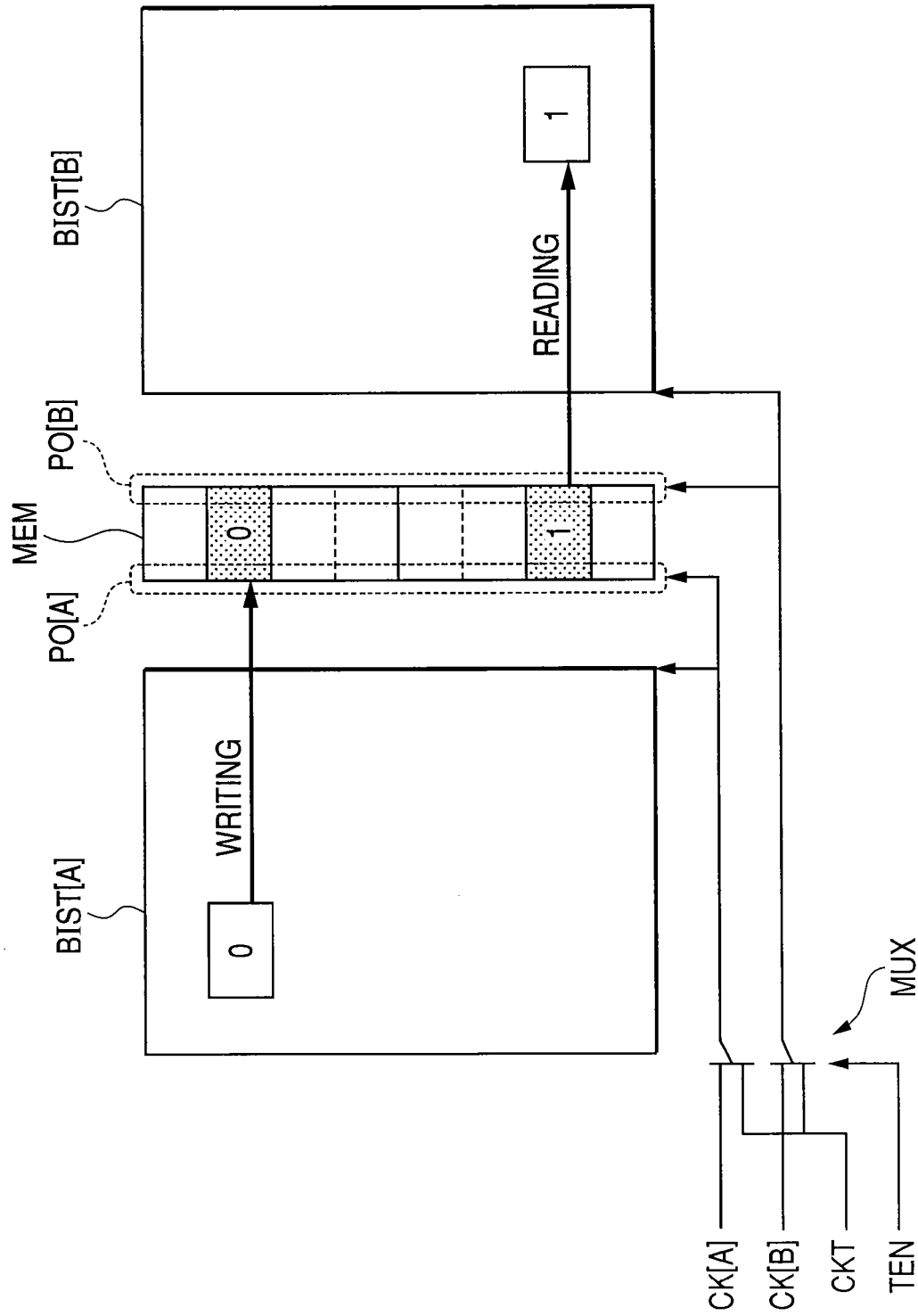

SEMICONDUCTOR DEVICE

CLAIM OF PRIORITY

The present application claims priority from Japanese application JP 2006-206077 filed on Jul. 28, 2006, the content of which is hereby incorporated by reference into this application.

FIELD OF THE INVENTION

The present invention relates to a semiconductor device, particularly to a technique to be applied effectively to a semiconductor that includes a BIST (Built In Self Test) circuit used for a multiport RAM.

BACKGROUND OF THE INVENTION

For example, Japanese Unexamined Patent Application Publication JP 1989-59173 A describes a two-port memory test pattern generator provided with two pairs of a timing signal generator for a two-port memory and a pattern generator. According to this configuration, for example, when carrying out a test for addresses 0 to 11, at first one of two pairs of the timing signal generator and the pattern generator carries out a write operation to addresses 0 and 11 with respect to the port A. At that time, upon ending the write operation in address 5 located halfway among the target addresses, a start signal is issued to the other pair, thereby the pair executes a read operation from addresses 0 to 5 with respect to the port B. Consequently, the write operation in addresses 6 to 11 with respect to the port A and the read operation from addresses 0 to 5 with respect to the read operation can be executed simultaneously with use of different clock frequencies, respectively. Thus the tests can be carried out asynchronously.

SUMMARY OF THE INVENTION

For example, the multiport RAM inhibits simultaneous accessing of the same memory cell (address) from plural ports. This is because an address conflict causes a problem that writing and reading are disabled or those operations slow down. To avoid such a problem, controlling is usually made so that the same memory cell (address) cannot be accessed at the same time from both ports [A] and [B] not only at the time of normal operation, but also even at the time of testing with use of a BIST circuit.

Such a controlling method can be realized easily in the case of testing carried out by synchronizing both ports [A] and [B] at the same speed. In other words, for example, as shown in FIG. 13, it is just required for the controlling to provide a test dedicated clock signal CKT and carry out a subject test so that data is written in the port [A] (PO[A]) of the multiport RAM (memory circuit MEM) with use of one BIST circuit (BIST [A]) and the data is read from the MEM port [B] (PO[B]) with use of the other BIST circuit (BIST[B]). Because they are synchronous tests, it is easy to keep an interval between writing address and reading address constantly, thereby address conflicts can be avoided easily.

However, such a test dedicated clock signal CKT is often built in the device together with a multiplexer MUX in the final designing stage and it might affect the timings of ordinary clock systems (CK[A] and CK[B]). Consequently, an ordinary clock system should preferably be used even in the BIST circuit to carry out the test as described above.

Furthermore, such a synchronous test method might also be confronted with difficulty in screening; the screening might not be made sufficiently. Practically, the multiport RAM is often driven at speeds different between the port [A] and the port [B]. Thus the synchronous test method is not so effective for practical test performance. Particularly, in recent years, along with accelerating progress of fine processes of 90 nm, 65 nm, etc., the clock frequency and power consumption have risen, as well as the connecting capacity between wirings and the wiring resistance have increased, thereby those factors have come to cause the electrical interference between ports, as well as the power supply noise in asynchronous operation to affect the synchronous test method as described above more significantly.

As a result, there has also arisen a demand for testing the port [A] side and the port [B] side at different speeds (asynchronous testing with different clocks) recently and it is required especially at that time to surely avoid address conflicts between the port [A] aide and the port [B] side. This is because each port works asynchronously, it is difficult to estimate whether or not a target address to be accessed from a port is also to be accessed from another port.

In such a situation, using the technique described in the JP 1989-59173 A has been considered as the asynchronous test method as described above. According to the technique, a problem of how to estimate accesses with respect to each of the ports as described above is solved by some rules provided practically for test patterns. For example, a test pattern in which writing is done to one port with a clock A while reading is done from another port with a clock B is used and a rule that the clock B is set faster than the clock A is set. And in this case, it is also required to make it a rule to make writing to one port with simple address scanning, that is, scanning in an ascending order of addresses and make reading from the other port in the similar address scanning.

Recently, however, in some cases, a writing port operation falls in malfunction due to a reading port operation (noise) and a reading port operation falls in malfunction due to a writing port operation (noise). And those malfunction mechanisms differ from each other. Consequently, to make screening of those malfunctions, a complicated test pattern is required. For example, a target port is required to make a simple operation while the other noise generating port is required to make many complicated operations or the address scanning is made reversely between one port and the other port.

There is also a case in which using multiport PAMs is diversified; the port A uses a higher clock frequency than that of the port B and vice versa. And the port operations are required to be assured, respectively to cope with various cases including the above one. Moreover, now that multiport RAMs such as two-port and three-port ones have also come to be used, it is more difficult to carry out the above tests by avoiding address conflicts.

Under such circumstances, the present invention has been made. And the above and further objects and novel features of the invention will more fully appear from the following detailed description when the same is read in connection with the accompanying drawings.

Among the objects disclosed in this specification, a typical one will be described below briefly.

According to one aspect of the present invention, the semiconductor device includes a memory circuit such as a multiport RAM that includes plural ports; a test circuit for carrying out a test for this memory circuit; and a pointer to be referred from the test circuit upon the carrying-out of the test. The test circuit divides an address space of the memory circuit virtually into plural segments and manages those segments individually, thereby accessing the memory circuit in segments to carry out a test thereof. The pointer denotes which of the plural segments is accessed by the test circuit through which of the plural ports. The test circuit refers to this pointer to control so that the plural ports cannot access one of the plural segments simultaneously upon testing the memory circuit.

In such a configuration of the semiconductor device, it is possible to execute an asynchronous memory circuit test with use of a complicated test pattern and with use of different clock frequencies for the plural ports, respectively, thereby improving the reliability of the semiconductor device.

Also in the configuration of the semiconductor device as described above, if the test circuit accesses the first segment through the first port, then the second segment just after the access to the first segment, the test circuit may access this first segment while the second port other than the first port does not access any of the first and second segments. Consequently, it is prevented surely that the same segment is accessed from plural ports simultaneously.

In another aspect of the present invention, in addition to the components as described above, the semiconductor device further includes a user logic circuit such as a processor capable of accessing the memory circuit. And this user logic circuit and the test circuit can refer to the pointer commonly as described above. Consequently, a complicated test pattern can be executed for the memory circuit test with use of the test circuit as described above and more useful enhanced functions can be provided for the user logic circuit to avoid address conflicts. At that time, the pointer can be realized by latching an activation signal with respect to any one of the hierarchical address decoders using the hierarchical address decoders of the memory circuit. As a result, the pointer can be realized easily or in a small space.

Hereunder, the effects to be obtained by typical one of the objects disclosed in this specification will be described below briefly. The effects can improve the reliability of a semiconductor that includes a multiport RAM.

BRIEF DESCRIPTION OF THE DRAWINGS

FIG. 13 is a configuration of a BIST circuit examined on the assumption of the present invention.

DETAILED DESCRIPTION OF THE PREFERRED EMBODIMENTS

Figure 1:
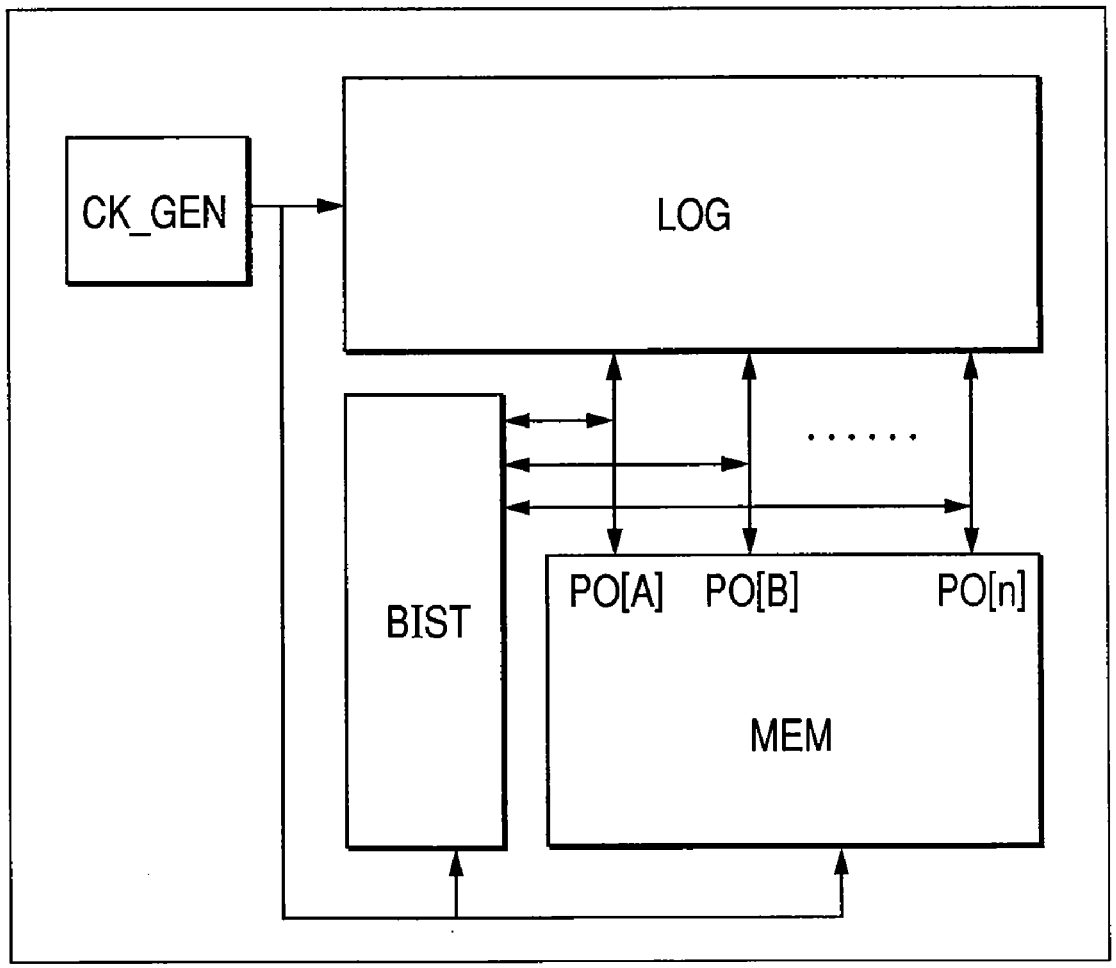
FIG. 1 is a block diagram of a configuration of a semiconductor device in a first embodiment of the present invention.

In the following description, the present invention will be divided into some sections or embodiments as needed for convenience. However, unless otherwise clarified particularly, those are related to each another; one is related to the other partially or wholly in description of the variations, details, complements, etc. And in the following embodiments, if the number of elements, etc. (including the quantity, values, amounts, ranges, etc.) is mentioned, the number is not limited; it may be more or less unless otherwise described clearly and limited clearly to a specific number in principle.

Furthermore, in the following embodiments, the components (including the element steps) are not always indispensable unless otherwise described clearly and considered to be indispensable clearly in principle. Similarly, in the following embodiments, the shapes, positional relationships, etc. of those components to be mentioned will include those that are practically approximate or similar unless otherwise described clearly and considered not to be so clearly in principle. This is also true for the values and ranges described above.

Hereunder, the preferred embodiments of the present invention will be described in detail with reference to the accompanying drawings. In all the drawings for describing those embodiments, the same reference numerals will represent the same or similar components, avoiding redundant description.

First Embodiment

FIG. 1 shows a block diagram of a configuration example of a semiconductor device in a first embodiment of the present invention. The semiconductor device shown in FIG. 1 consists of, for example, each type logic circuit LOG including a processor, a memory controller, etc.; a memory circuit MEM including a multiport RAM; a BIST circuit (BIST); a clock generation circuit CK_GEN such as a PLL (Phase Locked Loop), etc. that are all provided on a semiconductor substrate. The clock generation circuit CK_GEN supplies a clock signal to the logic circuit LOG, the memory circuit MEM, and the BIST circuit, respectively. The memory circuit MEM includes a multiport RAM provided with plural ports such as a port [A] (PO [A]), a port [B] (PO [B]), ..., port n (PO [n]). The memory circuit MEM exchanges data with the logic circuit LOG mutually. The BIST circuit, connected to each port of the MEM, enables the MEM to execute a self-diagnosis test.

Figure 2:
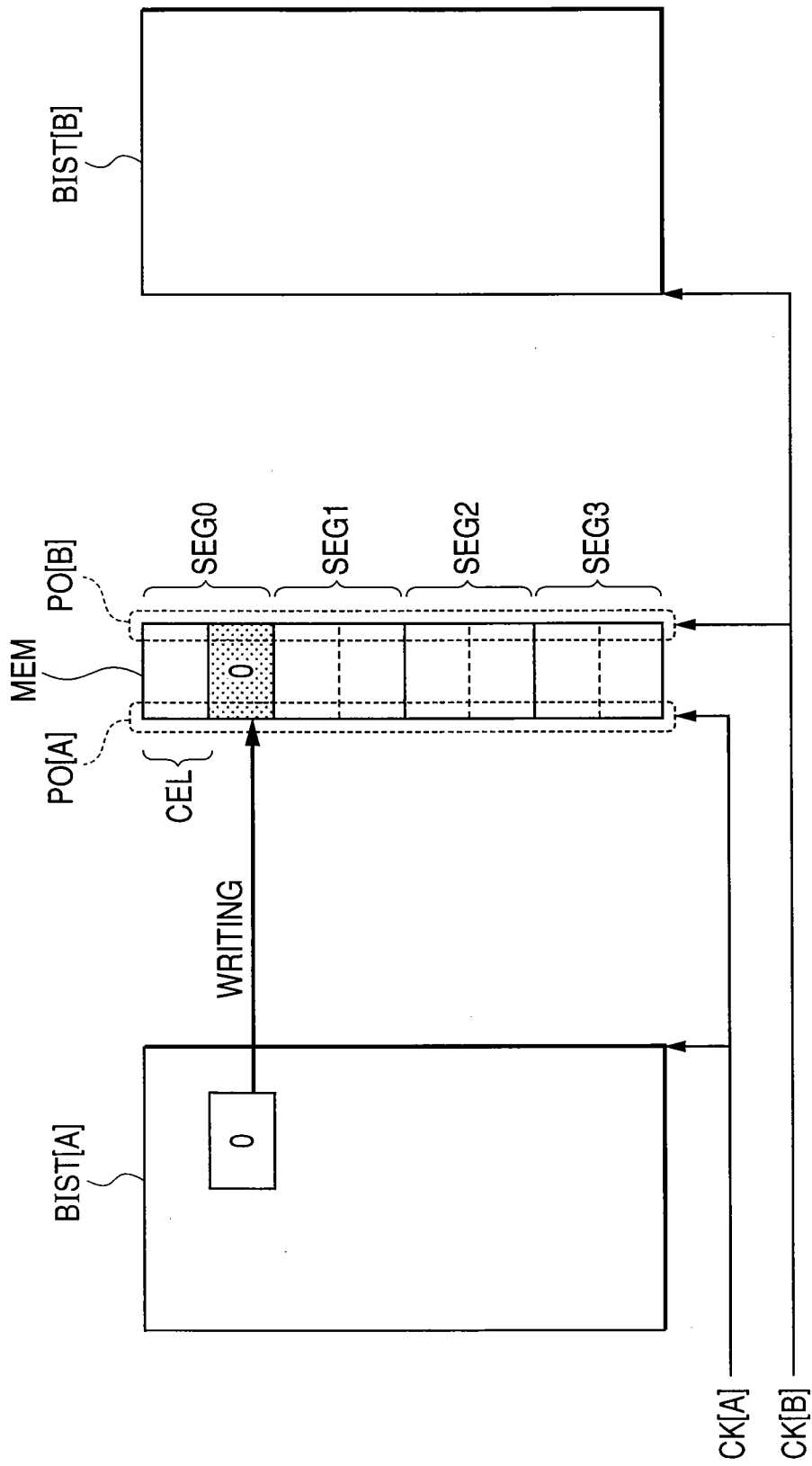
FIG. 2 is a concept diagram for describing an example of a function of a BIST circuit in the semiconductor device shown in FIG. 1.
Figure 3:
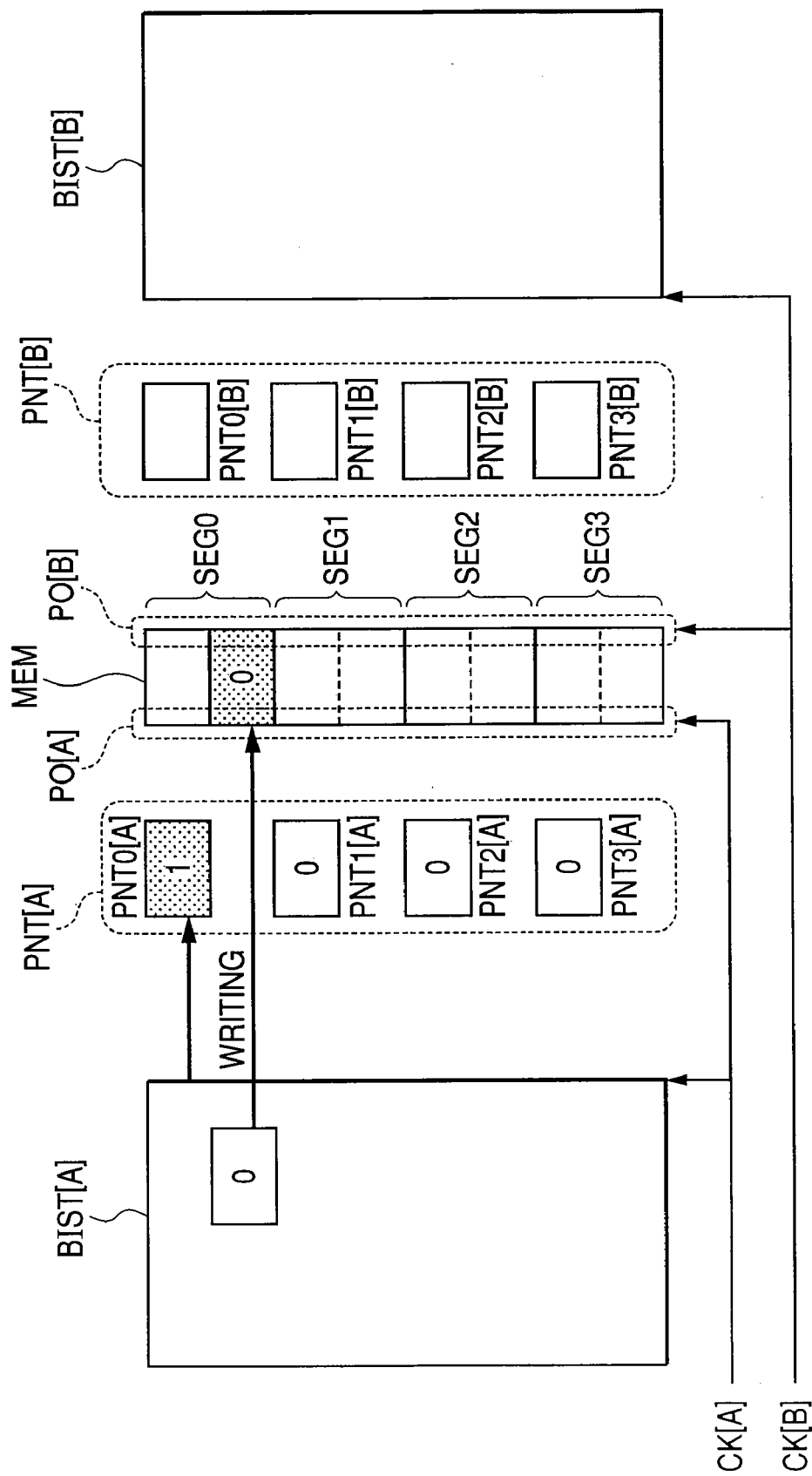
FIG. 3 is a concept diagram for describing an example of another function of the BIST circuit in the semiconductor device shown in FIG. 1.
Figure 4:
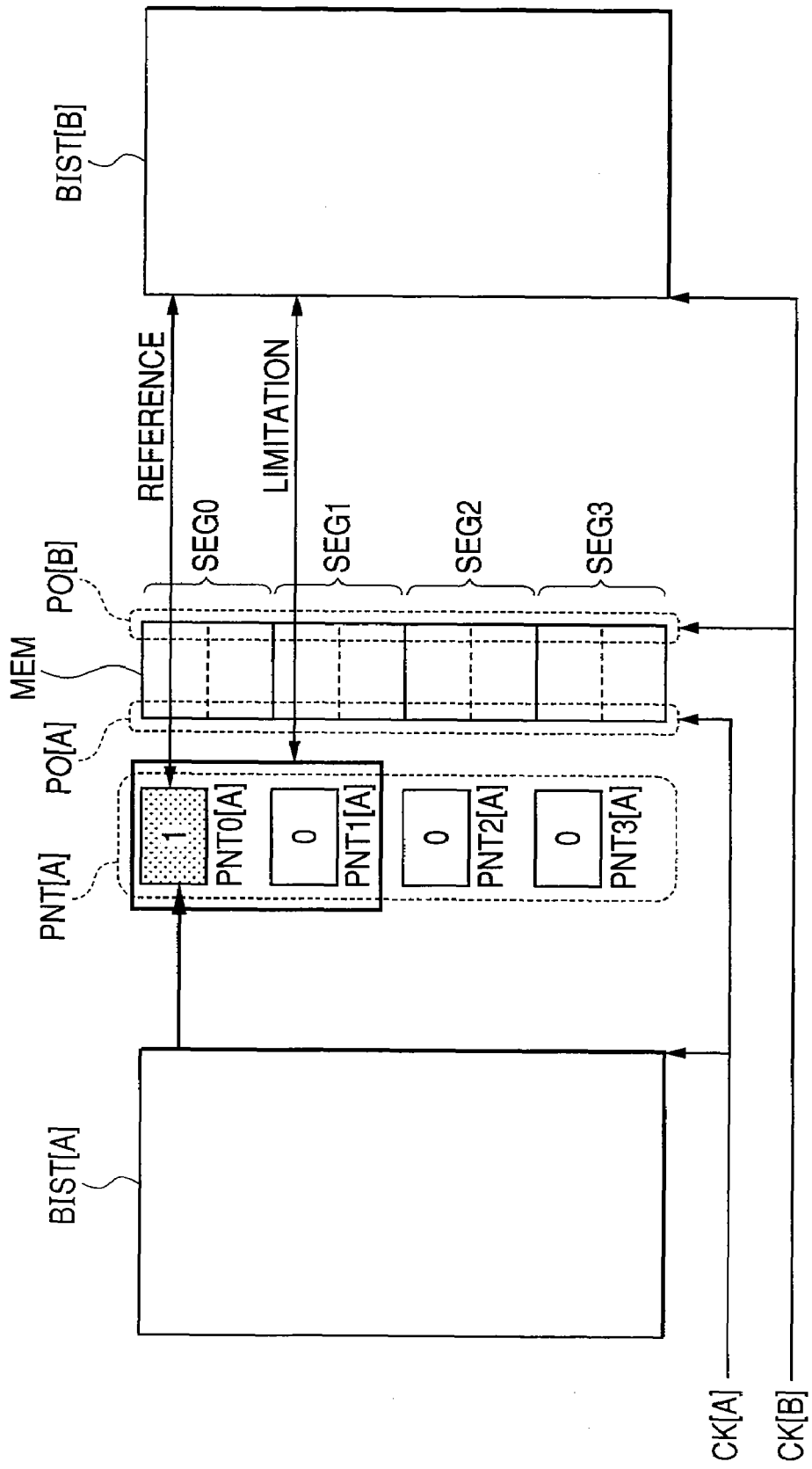
FIG. 4 is a concept diagram for describing still another function of the BIST circuit in the semiconductor device shown in FIG. 1.

FIGS. 2 through 4 show concept diagrams for describing examples of the functions of the BIST circuit of the semiconductor device shown in FIG. 1. In order to simplify the description, FIG. 2 shows only a memory circuit MEM including plural 8-bit memory cells CEL, a BIST circuit (BIST [A]) for carrying out a test at the MEM port [A] (PO [A]) side, and another BIST circuit (BIST [B]) for carrying out a test at the MEM port [B] (PO [B]) side. Each of the BIST [A] and the PO [A] operates synchronously with the clock signal CK[A] while each of the BIST [B] and the PO [B] operates synchronously with the clock CK[B]. The CK[A] and the CK[B] are ordinary clock signals supplied to the multiport RAM. Each of the CK[A] and the CK[B] can use a given frequency.

In such a configuration, firstly, each of the BIST [A] and the BIST [B] divides an MEM address space virtually to be tested and manages each divided address space as a segment. In FIG. 2, for example, it is assumed that one segment consists of two bits in the management of the address space. The memory addresses "0, 1", "2, 3", "4, 5", and "6, 7" are thus managed as "segment 0 (SEG0)", "segment 0 (SEG0)", "segment 1 (SEG1)", "segment 2 (SEG2)", "segment 3 (SEG3)". And, each of the BIST [A] and the BIST [B] keeps accessing only one segment for a certain period in each test operation.

Secondly, as shown in FIG. 3, PO [A] side pointers (flags) PNT0[A] to PNT3[A] and PO[B] side pointers (flags) PNT0 [B] to PNT3[B] are provided corresponding to those segments SEG0 to SEG4, respectively. The BIST[A], when accessing a segment, writes '1' in its corresponding PO[A] side pointer while the BIST[B], when accessing a segment, writes '1' in its corresponding PO[B] side pointer. In FIG. 3, for example, the BIST[A] writes '0' in the address 1 in the SEG0, then writes '1' in its corresponding pointer PNT0[A]. The BIST[A], when ending the access to the SEG0, writes '0' in the PNT0[A].

Thirdly, as shown in FIG. 4, the BIST[B] refers to the PO[A] side pointer corresponding to the target segment SEG and accesses the target SEG when '1' is not written in the pointer. If '1' is written, the BIST[B] suspends the accessing, for example, until '0' is written in the pointer. Although not shown in FIG. 4, similarly, the BIST[A] refers to the PO[B] side pointer corresponding to the target SEG and accesses the target SEG when '1' is not written in the pointer.

And upon referring to this pointer to make access limitation, the access limitation will be made more effectively if it is made for the two segments, that is, both current and next accesses to be made by the BIST[B] itself in addition to the access limitation for one segment as described above. In other words, in FIG. 4, the BIST[B] is requesting an access to the SEG0 currently and the BIST[B] expects to access the SEG1 next, the BIST[B] begins accessing the SEG0 only when the BIST[A] accesses none of the SEG0 and SEG1. In other words, the BIST[B] begins accessing SEG0 when '1' is not written in any of the PNT0[A] and PNT1[A].

This is because two accesses from the two BIST circuits might be done to one segment in some cases if the access limitation as described above is made only for one segment and both BIST[A] and BIST[B] refer to opposite side pointers, respectively and write values in their corresponding pointers at the same time. Such a trouble can be prevented easily and surely by making access limitation for the two segments to be accessed currently and next time. In some cases, this problem may also be avoided by exclusively controlling a period in which the BIST[A] refers to PNT0[B] and writes a value in PNT[A] and a period in which the BIST[B] refers to PNT[A] and writes a value in PNT[B] with use of a sequencer circuit or the like.

FIGS. 5 through 9 show concept diagrams for describing examples of the operation of the BIST circuit provided in the semiconductor device shown in FIG. 1. FIGS. 5 through 9 show a concrete example of the operation of the BIST circuit provided with the functions described in FIGS. 2 through 4. Here, it is assumed that each of the BIST[A] and BIST[B] makes accessing addresses cyclically in an ascending order and uses a clock frequency different from the other to carry out an asynchronous test.

Figure 5:
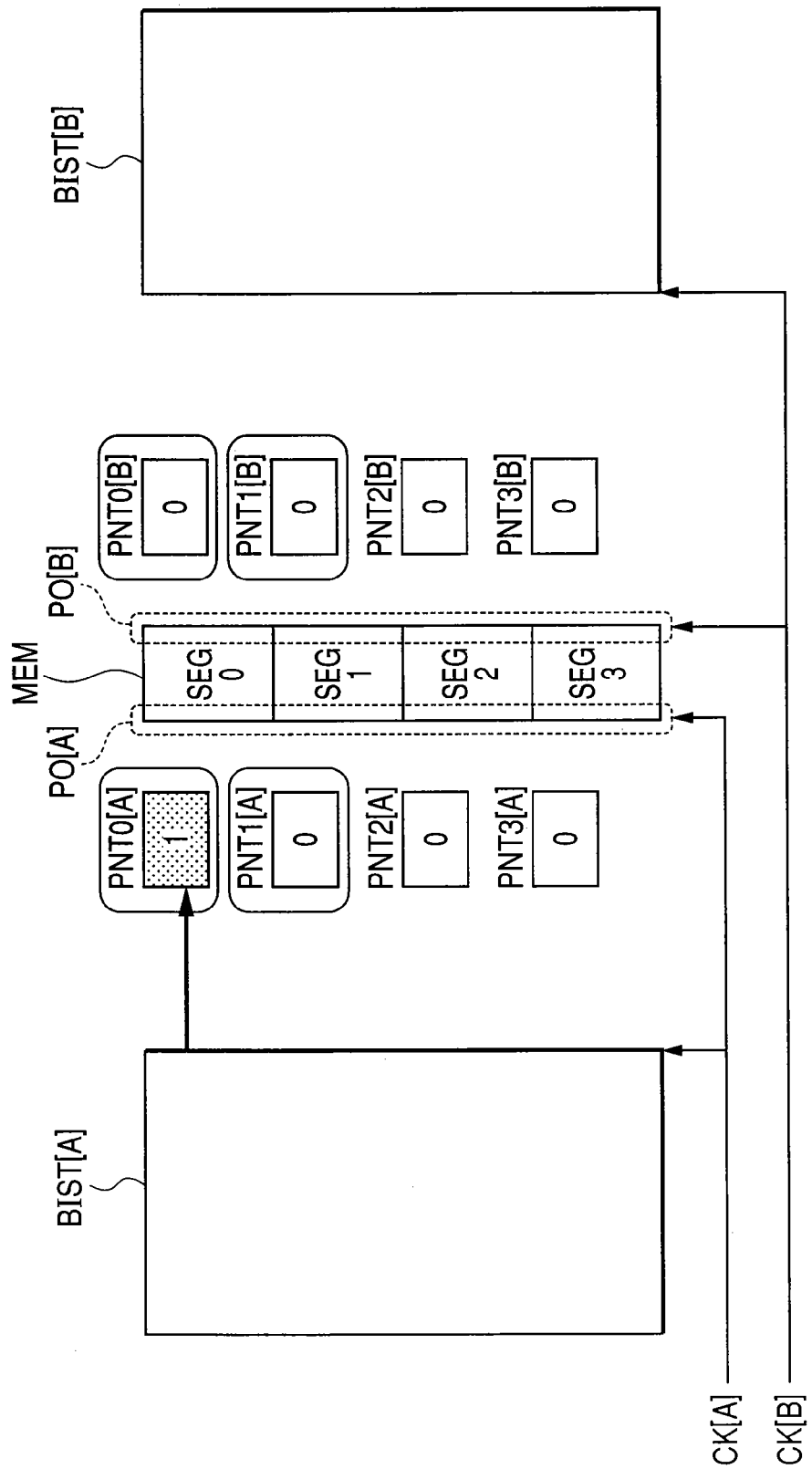
FIG. 5 is a concept diagram for describing still another function of the BIST circuit in the semiconductor device shown in FIG. 1.

In the initial state, '0' is written in every pointer. After that, as shown in FIG. 5, the BIST[A] confirms that '0' is written in both PNT0[B] and PNT1[B] corresponding to the current and next access target segments, then writes '1' in PNT0[A] and makes a write access to SEG0. On the other hand, the BIST [B], while expecting a read access to SEG0, suspends the access, since '1' is written in PNT0[A] corresponding to the current access target segment, and in PNT1[A] corresponding to the next access target segment.

Figure 6:
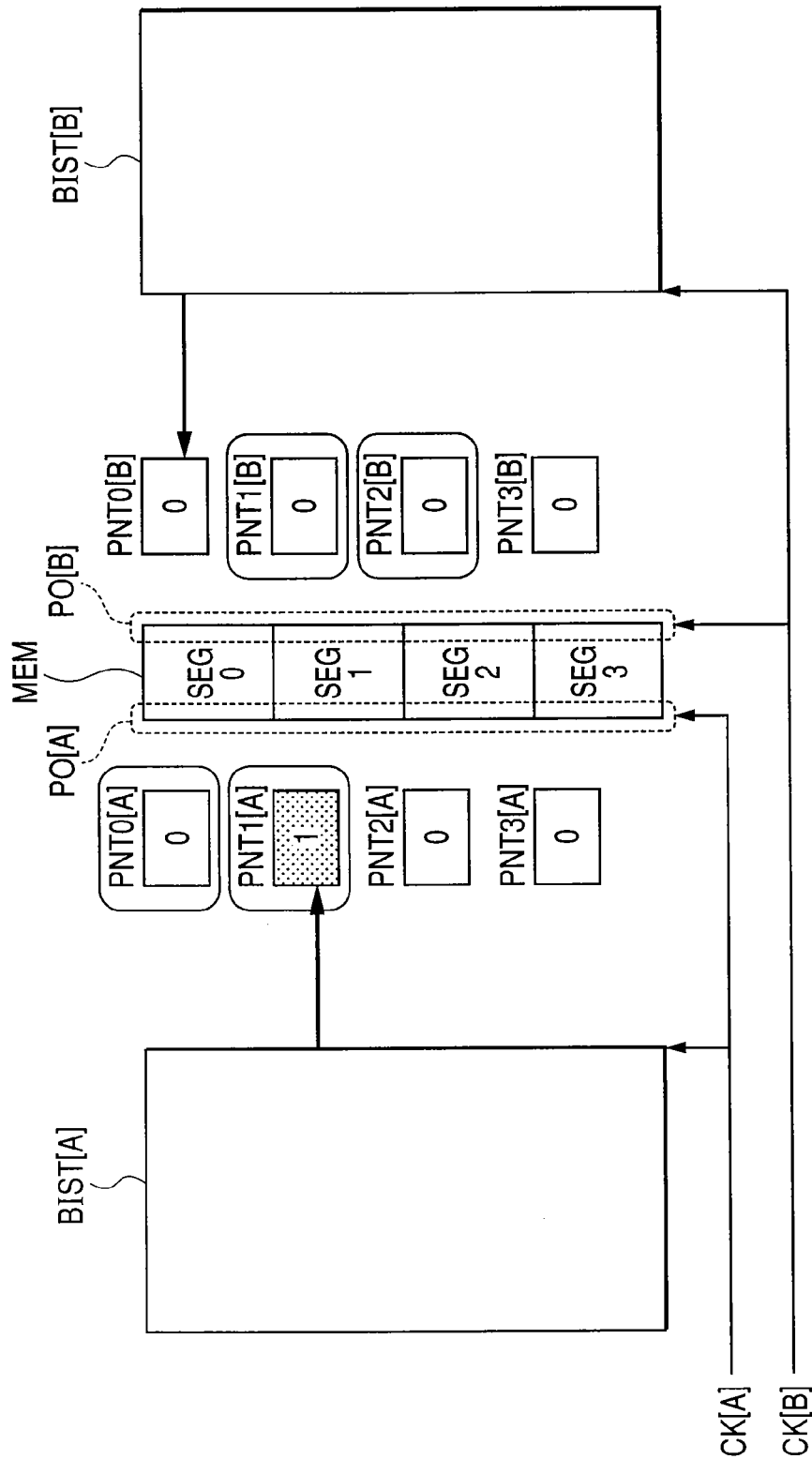
FIG. 6 is a concept diagram for describing an example of the operation continued from FIG. 5.

After that, as shown in FIG. 6, the BIST[A] writes '0' in PNT0 to end the access to SEG0, then confirms that '0' is written in both PNT1[B] and PNT2[B] and writes '1' in PNT1[A] to make an access to SEG1. On the other hand, the BIST[B] suspends the access, since '1' is written in PNT1, which is one of the two pointers PNT0[A] and PNT1[A].

Figure 7:
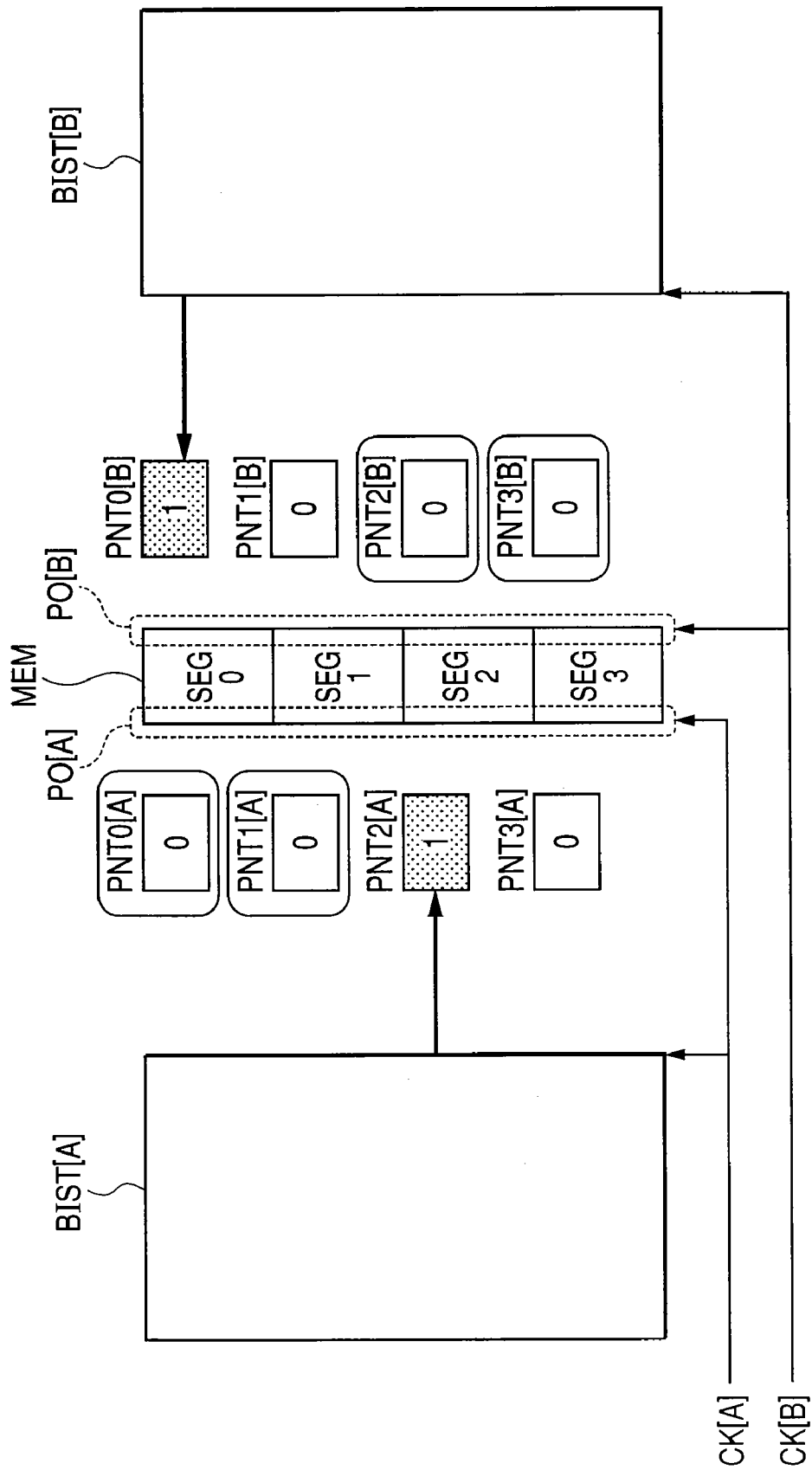
FIG. 7 is a concept diagram for describing an example of the operation continued from FIG. 6.

Then, as shown in FIG. 7, the BIST[A] writes '0' in PNT1 [A] to end the access to SEG1 and confirms that '0' is written in both PNT2[B] and PNT3[B], then writes '1' in PNT2 [A] to make a write access to SEG2. On the other hand, the BIST[B] confirms that '0' is written in both PNT0[A] and PNT1[A] and writes '1' in PNT0[B] to make a read access to SEG0. Here, it is assumed that the clock frequency CK[B] used by the BIST[B] is slower than the clock frequency CK[A] used by the BIST[A].

Figure 8:
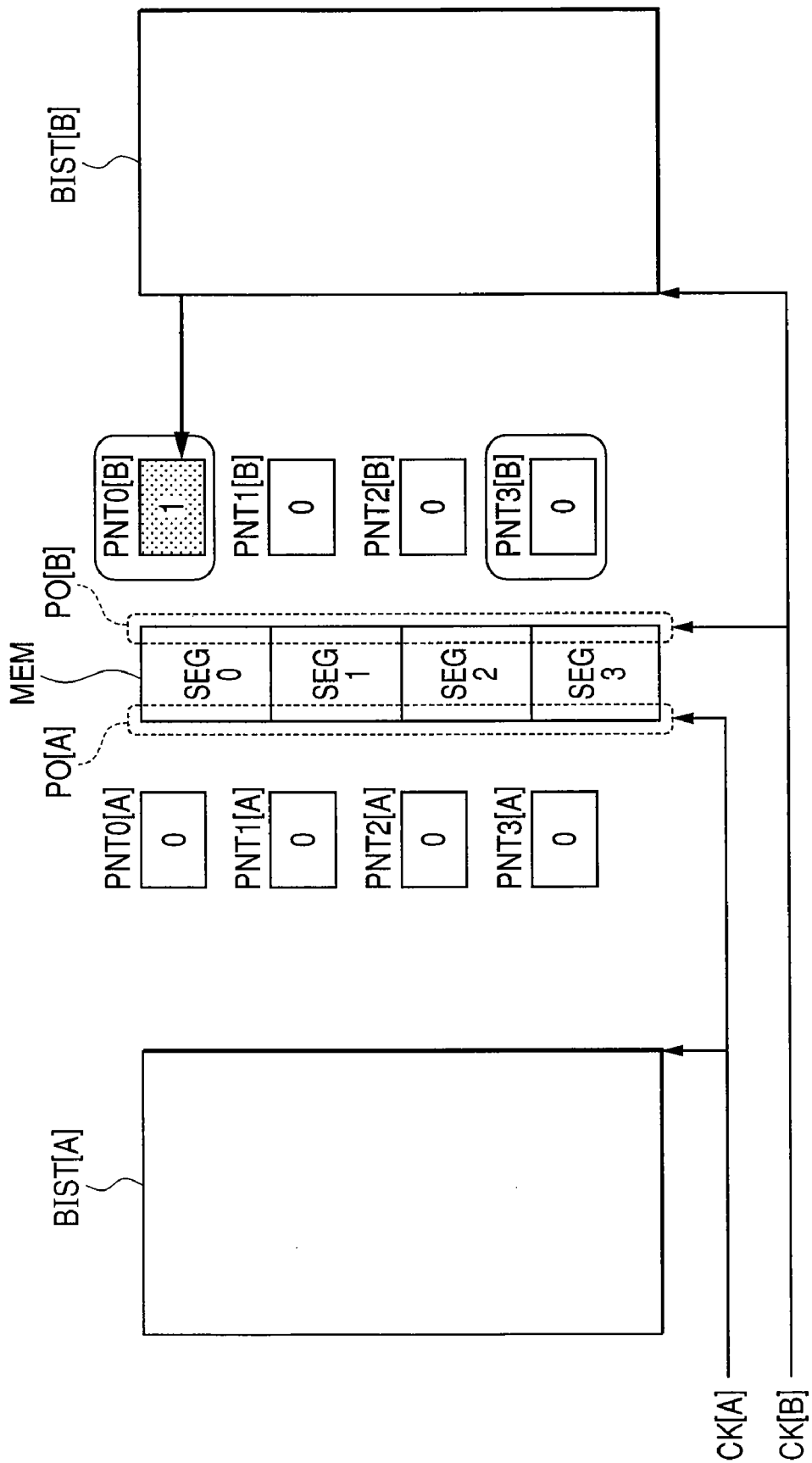
FIG. 8 is a concept diagram for describing an example of the operation continued from FIG. 7.

Then, as shown in FIG. 8, the BIST[A] writes '0' in PNT2 [A] to end the access to SEG2, and confirms that the values written in both PNT3[B] and PNT0[B]. And because '1' is written in PNT0[B], the BIST[A] suspends the access while the BIST[B] continues the read access to SEG0.

Figure 9:
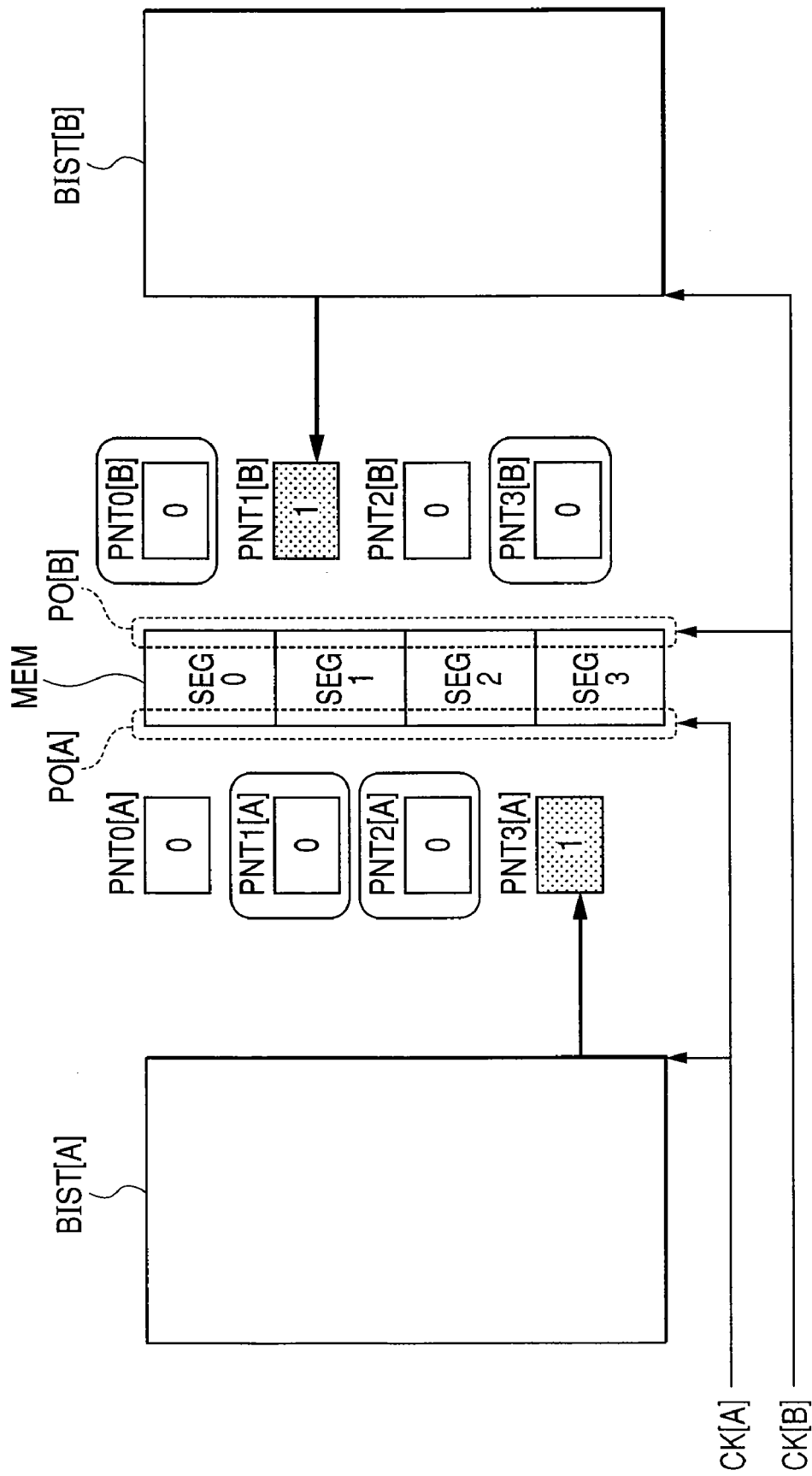
FIG. 9 is a concept diagram for describing an example of the operation continued from FIG. 8.

After that, as shown in FIG. 9, the BIST[B] writes '0' in PNT0[B] upon ending the access to SEG0 and confirms that '0' is written in both PNT1[A] and PNT2[A], then writes '1' in PNT1[B] to make a read access to SEG1. On the other hand, the BIST[A] confirms that '0' is written in both PNT3 [B] and PNT0[B] and writes '1' in PNT3[A] to make a write access to SEG4. Hereinafter, the memory accesses by the BIST circuits are controlled similarly.

As described above, a memory circuit address space is divided into segments and those segments are managed individually. In addition, a pointer is provided for each port with respect to each segment and the BIST circuit at the one port side refers to the pointer of the other port side to access the memory, thereby complicated test patterns can be executed while avoiding address conflicts. As a result, test patterns with high screening properties in asynchronous operations can be realized regardless of the clock frequency level of each port. Thus the reliability of the semiconductor device can be improved.

While a description has been made for the operation of a two-port RAM, this first embodiment can also apply to other multiport RAMs consisting of three ports or more, respectively. In other words, for a three-port RAM, it is just required to provide a BIST[C] and pointers PNT0[C] to PNT3[C] corresponding to the third port (port [C]) and to enable the BIST[C] to refer to the pointers PNT0[A] to PNT3[A] of the port [A] and the pointers PNT0[B] to PNT3[B] of the port [B] to access the memory.

Figure 10:
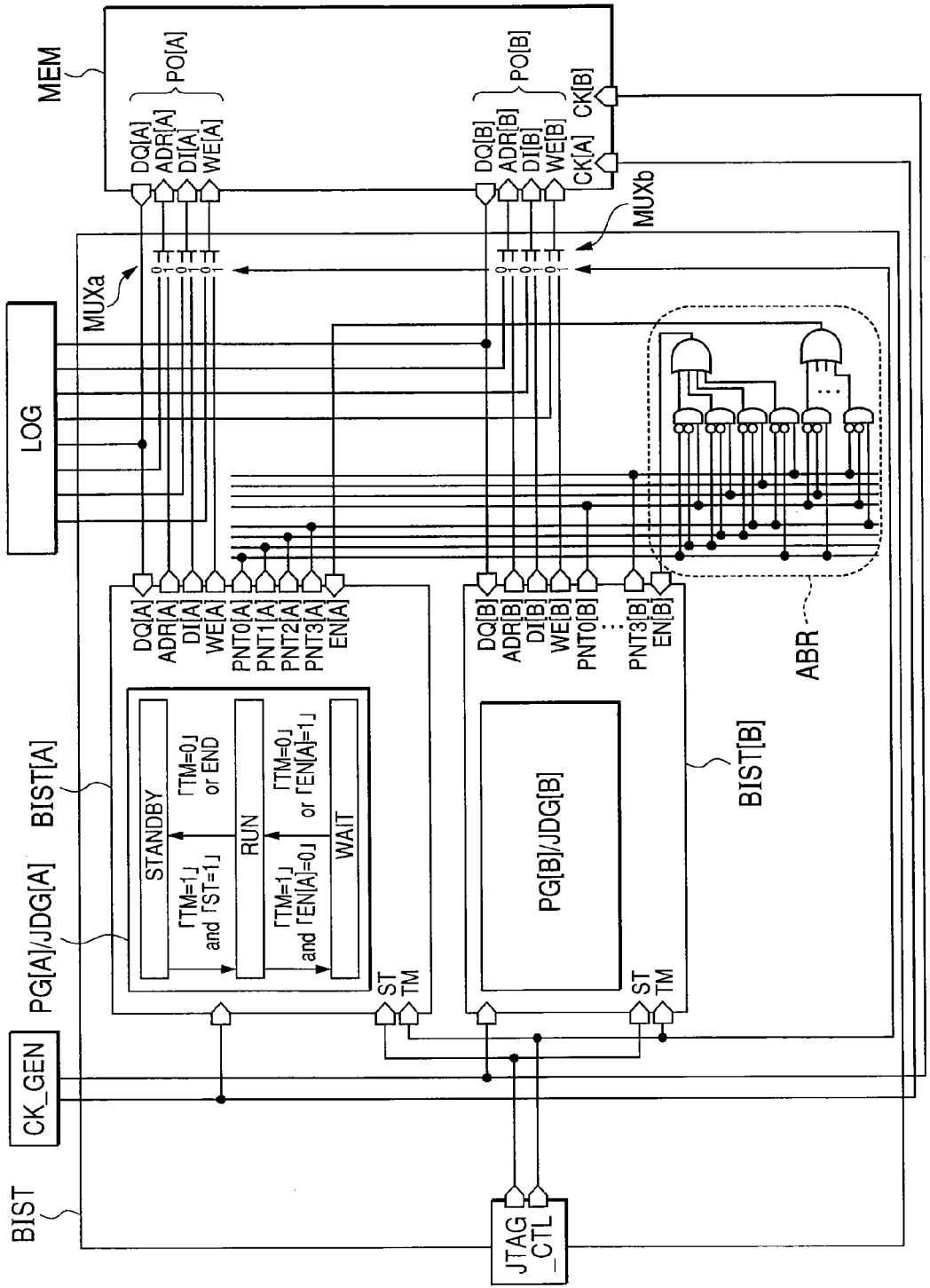
FIG. 10 is a circuit block diagram of a detailed configuration of the BIST circuit in the semiconductor device shown in FIG. 1.

FIG. 10 shows a block diagram of a detailed configuration of a BIST circuit in the semiconductor device shown in FIG. 1. The BIST circuit (BIST) shown in FIG. 10 includes, for example, a BIST circuit (BIST[A]) corresponding to the port [A] and another BIST circuit (BIST[B]) corresponding to the port [B], as well as an address conflict preventive circuit ABR, a JTAG control circuit JTAG_CTL, and multiplexers MUXa and MUXb.

The BIST[A] includes, for example, a test pattern generation circuit PG[A] consisting of a sequencer circuit, etc., a test result determination circuit JDG[A], etc. The BIST[A] inputs a clock signal CK[A] from the clock generation circuit CK_GEN, a BIST start signal ST and a test mode signal TM from the JTAG_CLT, a BIST enable signal EN [A] from the address conflict preventive circuit ABR, and a data signal DQ[A] from the PO[A] side of the memory circuit MEM. And the BIST[A] outputs an address signal ADR[A], a data signal DI[A], and a write enable signal WE[A] to the PO[A] side of the MEM and pointer signals PNT0[A] to PNT3[A] to the address conflict preventive circuit ABR. The ADR[A], DI[A], and WE[A] are inputted to the MEM through the multiplexer MUXa and a signal from the logic circuit LOG is inputted to the other side of the MUXa. The test mode signal TM is used to switch between both sides of this MUXa.

Similarly to the BIST[A], the BIST[B] includes a test pattern generation circuit PG[B], a test result determination circuit JDG[B], etc. The BIST[B] inputs a clock signal CK[B] from the clock generation circuit CK_GEN, a BIST start signal ST and a test mode signal TM from the JTAG_CLT, a BIST enable signal EN [B] from the address conflict preventive circuit ABR, and a data signal DQ[B] from the PO[B] side of the memory circuit MEM. And the BIST[B] outputs an address signal ADR[B], a data signal DI[B], and a write enable signal WE[B] to the PO[B] side of the MEM and pointer signals PNT0[B] to PNT3[B] to the address conflict preventive circuit ABR. The ADR[A], DI[B], and WE[B] are inputted to the MEM through the multiplexer MUXb and a signal from the logic circuit LOG is inputted to the other side of the MUXb. The test mode signal TM is used to switch between both sides of this MUXb.

The test pattern generation circuit PG[A] and the test result determination circuit JDG[A] are, for example, sequencer circuits including a standby state (STADBY), a test running state (RUN), and a temporary waiting state (WAIT), respectively. If "TM=1" and "ST=1" are inputted in the standby state, the device goes into the test running state (RUN) to generate a test pattern for the MEM and makes OK/NG determination for each data signal from the MEM. If "TM=1" and "EN[A]=0" are inputted in the test running state (RUN), the device goes into the temporary waiting state (WAIT), then if "TM=0" or a test ending signal END is inputted, the device goes into the standby state (STANDBY). If "TM=0" or "EN [A]=1" is inputted in the WAIT state, the device goes into the RUN state. The test pattern generation circuit PG[B] and the test result determination circuit JDG[B] are also similar to PG[A] and JDG[A].

The WAIT state means a state for avoiding an address conflict as described in FIGS. 2 through 9. For example, the BIST[B] can go into the WAIT state when '0' is written in the BIST enable signal EN [B] transmitted from the address conflict preventive circuit ABR. The ABR consists of, for example, plural logic elements and executes a logical operation for each of the values in the pointers PNT0[A] to PNT3 [A] and PNT0[B] to PNT3[B] to generate BIST write enable signals EN[A] and EN[B]. Here, it is assumed that pointer registers are provided in each of the BIST[A] and BIST[B]. For example, when the BIST[B] expects an access to SEG0, the BIST[B] writes '1' in PNT0[B] at first, and when the BIST[B] expects an access to SEG1, the BIST[B] writes '1' in PNT1[B] at first.

Then, as described in FIGS. 2 through 9, for example, the BIST[B] can access SEG0 only when '0' is written in both PNT0[A] and PNT1 [A] at the BIST[A] side (in other words, the BIST[A] does not access any of SEG0 and SEG1 at that time) and '1' is written in PNT0[B] at the BIST[B] side. And the BIST[B] can access SEG1 only when '0' is written in both PNT1[A] and PNT2[A] at the BIST[A] side and '1' is written in PNT1[B] at the BIST[B] side. Similarly, those conditions are also determined so as to enable accesses to SEG2 and SEG3. The ABR executes logical operations with AND and OR for those conditions and outputs EN[B]=1 when the conditions are satisfied and outputs EN[B]=0 when not satisfied.

When the ABR outputs EN[B]=0, the PG[B]/JDG[B] regards it as an address conflict state and the state is shifted from RUN to WAIT. After that, when the conditions are satisfied (that is, the address conflict state is avoided), the ABR outputs EN[B]=1, thereby the BIST[B] returns to the RUN state. In other words, for example, while the BIST[A] accesses SEG0, (PNT0[A]=1, PNT[A]=0), if the BIST[B] writes '1' in PNT0 [B] upon requesting an access to SEG0, the ABR outputs EN [B]=0, thereby the BIST[B] goes into the WAIT state. After that, if the BIST[A] ends the access to SEG0 and writes '0' in PNT0[A], the EN[B] value becomes 1 and the BIST[B] goes into the RUN state and is enabled to access SEG0.

Consequently, providing such an address conflict preventive circuit ABR makes it possible to carry out a test while avoiding address conflicts between ports [A] and [B]. In this embodiment, the EN [B] is activated on the condition of PNT0[A]='0', PNT1[A]='0', and PNT[B]='1' when the BIST[B] accesses SEG0 with use of an example of simple increment address scanning that the BIST[B] accesses SEG0, then accesses SEG1 immediately after the SEG0. This condition can be changed in various ways according to the subject test pattern address scanning method. In other words, for example, if the BIST[B] requests an access to SEG0, then requests an access to SEG2, it is just required for the BIST[B] to activate the EN[B] on the condition of PNT0[A]='0', PNT2[A]='0', and PNT0[B]='1'.

Even in case where the number of ports is 3 or over, the ABR input condition can be expanded similarly to cope with the case. Furthermore, in this embodiment, such a logic circuit as an ABR is incorporated in the device as shown in an example of a method for making logical determination of the address conflict state. However, there are also various other methods to be employed instead of the above method, for example, a method for making such logic determination of the address conflict state through a program processing by reading each pointer value with use of a processor or the like. And the test pattern generation circuit and the test result determination circuit can also be substituted for such a program processing using a processor or the like, respectively; they may not always be realized with sequencer circuits.

As described above, using the semiconductor device in the first embodiment makes it possible to execute asynchronous complicated test patterns for such memory circuits as multiport RAMs, thereby the reliability of the semiconductor device can be improved.

Second Embodiment

Figure 11:
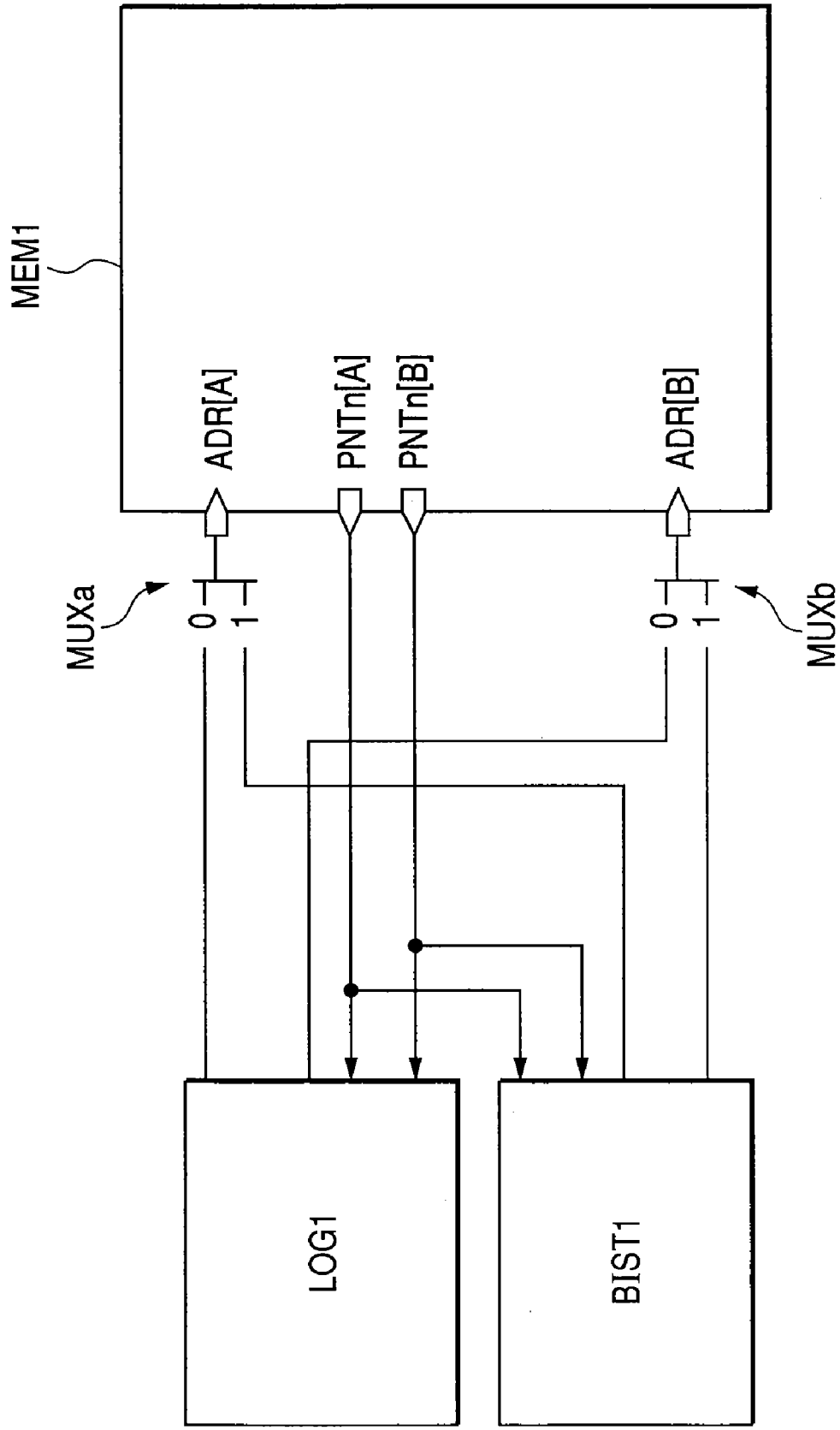
FIG. 11 is a block diagram of a configuration of a major part of a semiconductor device in a second embodiment of the present invention.
Figure 12:
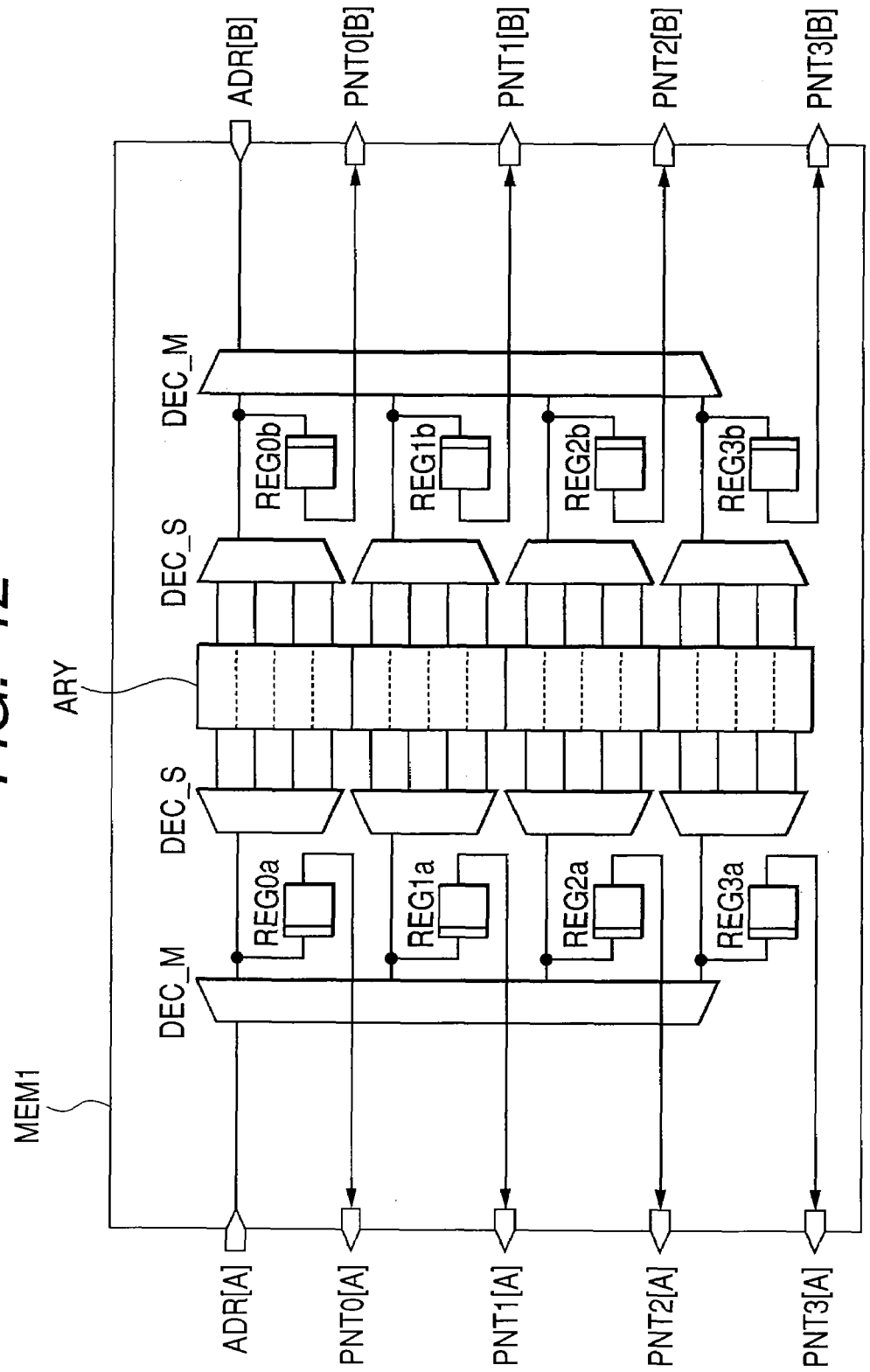
FIG. 12 is a concept diagram for describing a configuration of a memory circuit in the semiconductor device shown in FIG. 11.

A semiconductor device in a second embodiment is mainly characterized in that the pointer provided for each segment described in the first embodiment can be used commonly by such a logic circuit as a processor or the like and each BIST circuit. FIG. 11 shows a block diagram of a configuration of a major part of the semiconductor device in this second embodiment of the present invention. FIG. 12 shows a schematic diagram of a configuration of a memory circuit in the semiconductor device shown in FIG. 11.

The semiconductor device shown in FIG. 11 consists of, for example, each type logic circuit LOG1 including a processor, a memory controller, etc.; a memory circuit MEM1 including a multiport RAM; a BIST circuit (BIST1); multiplexers MUXa and MUXb, etc. The memory circuit MEM1 includes an address terminal (address signal) ADR[A] at the port [A] side and another address terminal (address signal)

ADR[B] at the port [B] side. The LOG1 and the BIST1 are connected to the ADR[A] through the MUXa and to the ADR[B] through the MUXb.

The semiconductor device shown in FIG. 11 is also provided with pointers as described in the first embodiment in the MEM1. The MEM1 includes a pointer (pointer signal) PNTn [A] corresponding to the port [A] and a pointer (pointer signal) ONTn[B] corresponding to the port [B] and those pointers can be accessed from both LOG1 and BIST1.

The memory circuit MEM1, as shown in FIG. 12, includes a memory cell array ARY and hierarchical address decoders corresponding to the ports [A] and [B], respectively. In this embodiment, the address decoders are assumed to be two-layer decoders, each of which includes a main decoder DEC_M[A] at the port [A] side and four sub-decoders DEC_S[A] in the layer under the main decoder DEC_M[A], as well as a main decoder DEC_M [B] at the port [B] side and four sub-decoders DEC_S [B] in the layer under the main decoder DEC_M [B] similarly. And each of the four activate signals output from each main decoder to its four sub-decoders is provided with a pointer register.

As shown in FIG. 12, the MEM1 is provided with four pointer registers REG0a to REG3a used to latch four activate signals output to the four sub-decoders DEC_S[A] and four pointer registers REG0b to REG3b used to latch four activation signals output to the four sub-decoders DEC_S[B]. The outputs of the REG0a to REG3a become values of the pointers PNT0[A] to PNT3[A] and the outputs of the REG0b to REG3b become the values of pointers PNT0[B] to PNT3[B]. The segment unit described in the first embodiment is assumed as an address unit of the sub-decoders DEC_S.

In such a configuration, it is possible to use those pointers for the BIST circuit as described in the first embodiment, as well as for the logic circuit LOG1, which is assumed as a user logic circuit. This means that those pointers can be used to avoid address conflicts while the logic circuit LOG1 accesses the memory circuit MEM1 under the control of a user program, not to avoid address conflicts while the BIST circuit carries out a test. Consequently, the semiconductor device in this second embodiment can become more convenient for the user.

It is also possible to omit an arbitration circuit that might otherwise be needed as a user logic circuit to avoid address conflictions. And as shown in FIG. 12, address decoder signals can be used effectively to realize pointers easily or in a small space. In addition, because this pointer function can be guaranteed through a test carried out in the BIST circuit, the reliability of the semiconductor device can be assured without increasing the testing cost.

While the preferred form of the present invention has been described concretely with reference to two embodiments, it is to be understood that modifications are apparent to those skilled in the art without departing the spirit of the invention. For example, while dedicated pointer registers are provided in the embodiments described above, those registers can also be substituted for address registers, etc. for storing addresses to be tested with respect to a memory circuit. In other words, the configuration may be determined so that some specific bits selected from plural bits for denoting an address and corresponding to each divided segment can be checked to identify a segment being accessed and those specific bits can also be referred to avoid address conflicts.

The configuration of the semiconductor device of the present invention is therefore preferably employed as semiconductor devices that include a multiport RAM, respectively.

What is claimed is:

1. A semiconductor device, comprising:
a memory circuit that includes a memory array and a plurality of ports capable of accessing said memory array with different frequencies, respectively;
an access management circuit configured to divide an address space of said memory array into a plurality of segments virtually and to control accessing said memory array segment by segment;
a plurality of test circuits provided correspondingly to said ports, said test circuits being configured to access said memory array segment by segment concurrently and asynchronously via the corresponding ports, respectively, and to perform various tests on said memory circuit, each said test being different from each other of said tests; and a set of pointers provided correspondingly to said plurality of segments, said pointers being configured to indicate access statuses of which segments are currently accessed by said test circuits and which ports are used for accessing the memory circuit while the test circuits perform the tests on the memory circuit concurrently and asynchronously,
wherein each respective test circuit is configured to refer to the pointers and to perform a test assigned to the test circuit on one of said plurality of segments when the pointer assigned to a target segment indicates that the target segment is not currently accessed by any of the other test circuits, or to temporarily suspend the assigned test on the target segment when the pointer indicates that the target segment is currently accessed by one of the other test circuits, thereby to allow said plurality of test circuits to perform various tests concurrently on said memory circuit.

2. The semiconductor device according to claim 1, wherein said pointers include registers each having a number of bits which is the same as a number of said ports and a number of said segments, and
wherein said test circuit, upon accessing any one of said plurality of segments and upon ending of said accessing, to write into the corresponding registers bit data corresponding to the ports and the segments accessed by the test circuits, respectively.

3. The semiconductor device according to claim 1, wherein said memory circuit includes a plurality of hierarchical address decoders provided correspondingly to said ports,
wherein each said hierarchical address decoder includes a main decoder to which address signals are supplied and a plurality of sub-decoders provided correspondingly to said segments and coupled to said main decoder, and
wherein said pointers are provided between the main decoder and its sub-decoders so that one of the sub-decoders that corresponds to the target segment to be accessed is coupled to said main decoder by latching an activation signal at the pointer corresponding to the target segment.

4. The semiconductor device according to claim 1, wherein, for a sequence of accessing a first one of the segments and then accessing a second one of the segments, the test circuit assigned to perform the access sequence accesses said first segment through a first one of the ports when the pointer referred to by the test circuit indicates that no port other than said first port is accessing said first segment.

5. The semiconductor device according to claim 1, wherein each respective test circuit is configured to, after an access is temporarily suspended to the target segment, restart said suspended access when the pointer indicates ending of said access to said first segment.

6. A semiconductor device, comprising:
a memory circuit that includes a memory array, a first port for configured to allow accessing said memory array with a first clock frequency, and a second port configured to allow accessing said memory array with a second clock frequency;
an access management circuit configured to divide an address space of said memory array into a plurality of segments virtually and to control accessing said memory array segment by segment;
first and second test circuits provided correspondingly to said first and second ports, each said test circuit being configured to carry out various test sequences on said memory circuit by accessing said memory array segment by segment concurrently and asynchronously via the corresponding ports, each said test being different from each other said test; and
first and second sets of pointers each provided correspondingly to said plurality of segments and configured to indicate access statuses of which segments are currently accessed by said first and second test circuits which carry out the test sequences concurrently and asynchronously,
wherein the first test circuit refers to said second set of pointers and the second test circuit refers to said first set of pointers, and
wherein one of said first and second test circuits is configured to perform an assigned test sequence on a target segment when the pointer referred to indicates that the target segment is not accessed by any of the other test circuit, and to temporarily suspend the assigned test sequence on the target segment when the pointer referred to indicates that the target segment is accessed by the other test circuit, thereby to allow said first and second test circuits to perform various tests which are different from one another concurrently on said memory circuit.

7. The semiconductor device according to claim 6,
wherein one of said first and second pointers is configured with a register the number of bits of which is the same as the number of said plurality of segments,
wherein said one of said first and second test circuits is configured, upon accessing any of said plurality of segments and upon ending of said access, to write into the corresponding register a bit value corresponding to the segment accessed by the test circuit.

8. The semiconductor device according to claim 6,
wherein, for a sequence of accessing a first one of the segments and then accessing a second one of the segments, the test circuit assigned to perform the access sequence accesses said first segment when the pointer referred to by the test circuit indicates that said first segment is not accessed by the other test circuit.

9. The semiconductor device according to claim 8,
wherein each said test circuit is configured to, after it suspends access to said target segment, restart access to said target segment when the pointer referred to by the test circuit indicates that the other test circuit has ended its access to said target segment.

10. The semiconductor device according to claim 9,
wherein said semiconductor device further includes an address conflict preventive circuit to which signals are input from said first and second pointers and which outputs first and second enable signals,
wherein said first test circuit includes a first sequencer circuit that includes a first test running state for generating a first test pattern output to said first port and a first suspension state for suspending generation of said first test pattern while said first sequencer circuit shifts said first test running state and said first suspension state according to said first enable signal, and
wherein said second test circuit includes a second sequencer circuit that includes a second test running state for generating a second test pattern output to said second port and a second suspension state for suspending generation of said second test pattern while said second sequencer circuit shifts said second test running state and said second suspension state according to said second enable signal.

11. A semiconductor device, comprising:
a memory circuit that includes a memory array and a plurality of ports configured to access said memory array with frequencies different from one another;
a plurality of circuit units configured to execute various function-specified programs by accessing said memory array concurrently and asynchronously via said ports;
an access management circuit configured to divide an address space of said memory array into a plurality of segments and to control accessing said memory array segment by segment; and
a set of pointers provided correspondingly to said plurality of segments, said pointers being configured to indicate access statuses of which segments are currently accessed by said circuit units and which of said plurality of ports are currently used for accessing the memory circuit while the circuit units execute the function-specified programs by accessing the memory circuit concurrently and asynchronously,
wherein each respective circuit unit is configured to refer to the pointers and to execute an assigned function-specified program by accessing one of said plurality of segments when the pointer assigned to a target segment indicates that the target segment is currently accessed by none of said ports simultaneously, thereby to allow said plurality of circuit units to carry out the various function-specified programs by accessing said memory circuit concurrently.

12. The semiconductor device according to claim 11,
wherein said memory circuit includes a plurality of hierarchical address decoders provided correspondingly to said ports,
wherein each said hierarchical address decoder includes a main decoder to which address signals are supplied and a plurality of sub-decoders provided correspondingly to said segments and coupled to said main decoder, and
wherein said pointers are provided between the main decoder and its sub-decoders so that one of the sub-decoders that corresponds to the target segment to be accessed is coupled to said main decoder by latching an activation signal at the pointer corresponding to the target segment.

13. The semiconductor device according to claim 11,
wherein said circuit units are test circuits configured to execute various test sequences on said memory array concurrently and asynchronously.

14. The semiconductor device according to claim 11,
wherein said circuit units are logic circuits configured to execute user-specified application programs by accessing said memory array concurrently and asynchronously.

* * * * *